(12) United States Patent
Tokiwa

(10) Patent No.: US 7,590,006 B2
(45) Date of Patent: Sep. 15, 2009

(54) SEMICONDUCTOR MEMORY DEVICE

(75) Inventor: Naoya Tokiwa, Fujisawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 166 days.

(21) Appl. No.: 11/754,531

(22) Filed: May 29, 2007

(65) Prior Publication Data

US 2007/0297236 A1   Dec. 27, 2007

(30) Foreign Application Priority Data

Jun. 23, 2006   (JP)   ............................ 2006-173230

(51) Int. Cl.
  *G11C 16/06*   (2006.01)
(52) U.S. Cl. ............................ 365/185.22; 365/185.09; 365/185.17
(58) Field of Classification Search ............ 365/185.22, 365/185.09, 185.17
  See application file for complete search history.

(56) References Cited

U.S. PATENT DOCUMENTS

| 6,195,290 | B1 | 2/2001 | Dallabora et al. |
| 6,606,268 | B2 | 8/2003 | Maruyama |
| 6,859,401 | B2 | 2/2005 | Hosono et al. |
| 7,130,222 | B1* | 10/2006 | Ho et al. ................. 365/185.22 |

OTHER PUBLICATIONS

U.S. Appl. No. 12/015,755, filed Jan. 17, 2008, Tokiwa, et al.
U.S. Appl. No. 12/040,155, filed Feb. 29, 2008, Tokiwa.

* cited by examiner

*Primary Examiner*—Huan Hoang
(74) *Attorney, Agent, or Firm*—Oblon, Spivak, McClelland, Maier & Neustadt, P.C.

(57) ABSTRACT

A semiconductor memory device includes: a memory cell array with electrically rewritable and non-volatile memory cells arranged therein; a data storage circuit configured to store data simultaneously read from or written into the memory cell array, the data constituting a collective processing unit; and a data state judgment circuit configured to sequentially judge the data states of multiple divided areas, which are obtained by dividing the collective processing unit.

15 Claims, 19 Drawing Sheets

FIG. 16 [PRIOR ART]
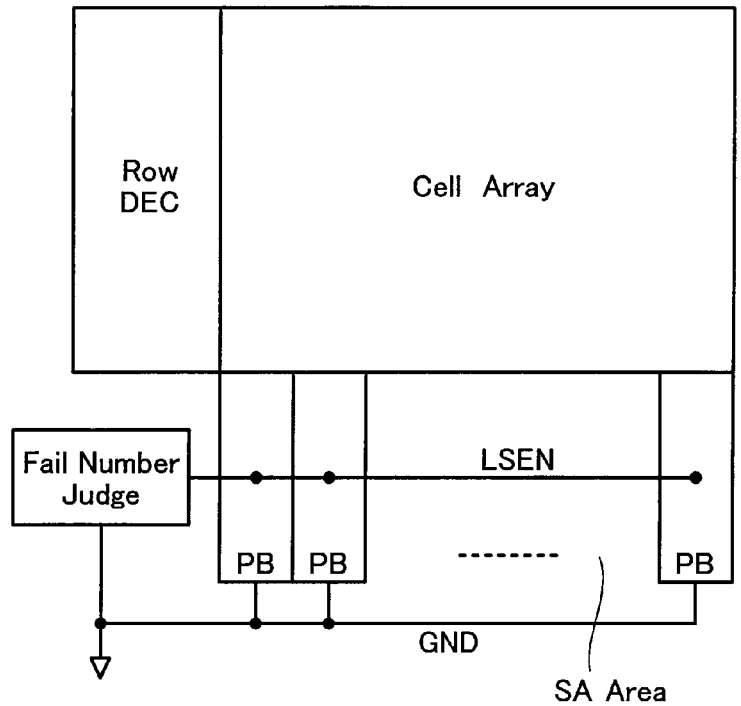
FIG. 17
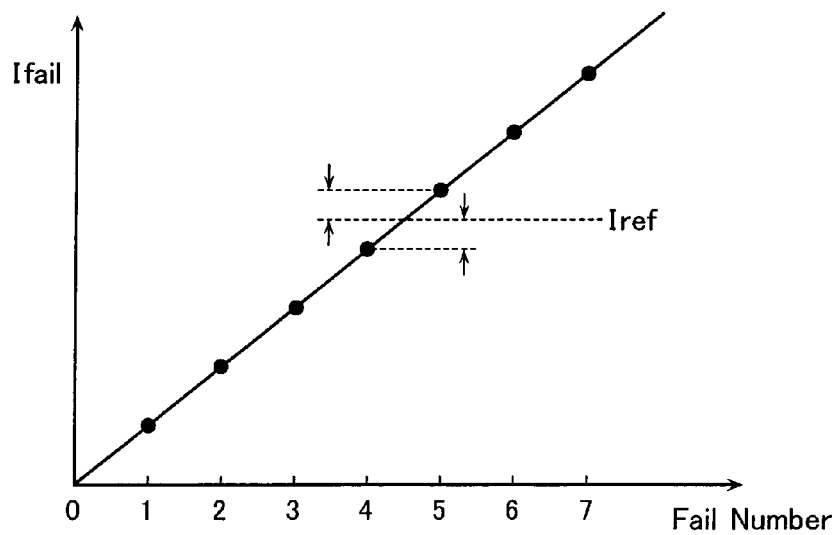

_US 7,590,006 B2_

SEMICONDUCTOR MEMORY DEVICE

CROSS-REFERENCE TO RELATED APPLICATION

This application is based on and claims the benefit of priority from the prior Japanese Patent Application No. 2006-173230, filed on Jun. 23, 2006, the entire contents of which are incorporated herein by reference.

BACKGROUND OF THE INVENTION

1. Field of the Invention

This invention relates to a semiconductor memory device, specifically to an improved verify-judgment method in a write/erase mode of an electrically rewritable and non-volatile memory (EEPROM).

2. Description of the Related Art

A NAND-type flash memory is known as one of EEPROMs, which has such features as follows: unit cell area thereof is smaller than that of the NOR-type flash memory; and it is easy to make the capacity large. Therefore, it is mainly adapted to such applications as a file memory and the like.

Usually, data write of the NAND flash memory is executed by a page (for example, one page is formed of 2 kByte main column and 64 Byte redundant column) while data erase thereof is executed by a block (for example, one block is formed of 128 pages).

Since there are variations in memory cell characteristics, data write and erase are executed together with write-verify and erase-verify for verifying the write state and erase state, respectively. Further, in case an error checking and correcting system (e.g., ECC system) is prepared inside or outside the memory chip, a certain number of fails may be dealt with a "pseudo-pass" state as being defined by the ability of the ECC system.

From the above-described view point, there has already been provided a verify-judge circuit, in which a permissible fail number is settable (refer to, for example, JP-P2002-140899A).

Since the verify-judge circuit is for judging the verify result based on data stored in data latches disposed in a page sense amplifiers (i.e., page buffers), detection line thereof is basically disposed on the sense amplifier circuit area. FIG. 16 shows the schematic layout. That is, sense amplifiers PB are arranged along one side of the cell array while row decoder RowDEC is disposed on another side perpendicular to it. Detection line LSEN is disposed to cross the sense amplifier circuit area, and a fail number detection circuit is disposed at one end of the sense amplifier circuit area for detecting the level transition of the detection line LSEN to judge the fail number.

According to this configuration, the more the number of one page sense amplifiers, by which a collective read/write range is defined, the larger the parasitic resistance of the detection line LSEN or ground potential line GND crossing the sense amplifier circuit area. This will affect the precision of the verify-judgment. Specifically, in case a current comparison scheme is used for verify-judging, it becomes impossible to precisely detect the fail number (fail column number or fail bit number) because some noises are added from other lines.

For example, FIG. 17 shows a relationship between current Ifail flowing on the detection line LSEN and the fail number. Current Ifail is dispersed in relation to the fail number. Comparing the current Ifail with a reference current Iref shown in FIG. 17, it will be detected that the fail number is under a certain value.

To avoid erroneous PASS/FAIL detection, as shown in FIG. 17, the reference current Iref is usually set at the center value between adjacent two dispersed fail current values. However, if the fail current-fail number characteristic is changed due to a parasitic wiring resistance and the like, it becomes impossible to detect precisely the fail number. Especially, in case the permissible fail number is set to be large, it will often occur to erroneously detect the fail number.

In the recent flash memory, for the purpose of improving the write performance, the page length, i.e., data write unit, trends toward increasing. On the other hands, as the flash memory is miniaturized more, it becomes necessary to install an ECC system for securing data reliability. The ECC system is so formed as to embed an error correcting code in a redundant area in a page, thereby detecting and correcting an error bit(s) at a read time. As the page length is increased more, the number of redundant columns assigned to the ECC circuit is increased more, and this results in that more write-insufficient and more erase-insufficient data become permissible.

If the verify-judging circuit is not able to detect precisely the fail number, thereby erroneously detecting a to-be-detected "FAIL" state as a "PASS" state, it means that the write sequence ends with a non-correctable defect. By contrast, if the verify-judging circuit detects a to be-detected "PASS" state as a "FAIL" state, this means that the performance of the flash memory has been judged severely over the necessity, and there is a fear of shortening the life time apparently.

SUMMARY OF THE INVENTION

According to an aspect of the present invention, there is provided a semiconductor memory device including:

a memory cell array with electrically rewritable and non-volatile memory cells arranged therein;

a data storage circuit configured to store data simultaneously read from or written into the memory cell array, the data constituting a collective processing unit; and a data state judgment circuit configured to sequentially judge the data states of multiple divided areas, which are obtained by dividing the collective processing unit.

According to another aspect of the present invention, there is provided a semiconductor memory device including:

a memory cell array with electrically rewritable and non-volatile memory cells arranged therein;

a sense amplifier circuit configured to store data constituting a collective processing unit, the data being simultaneously read from or written into the memory cell array; and a verify-judge circuit configured to judge write completion or erase completion based on verify-read data stored in the sense amplifier in such a way as to sequentially verify-judging multiple divided areas, which are obtained by dividing the collective processing unit.

BRIEF DESCRIPTION OF THE DRAWINGS

FIG. 16 shows a conventional layout of detection lines used for judging fail number.

FIG. 17 is a characteristic diagram for explaining erroneous judgment in the conventional fail number judging scheme.

DETAILED DESCRIPTION OF THE EMBODIMENTS

Illustrative embodiments of this invention will be explained with reference to the accompanying drawings below.

Embodiment 1

Figure 1:
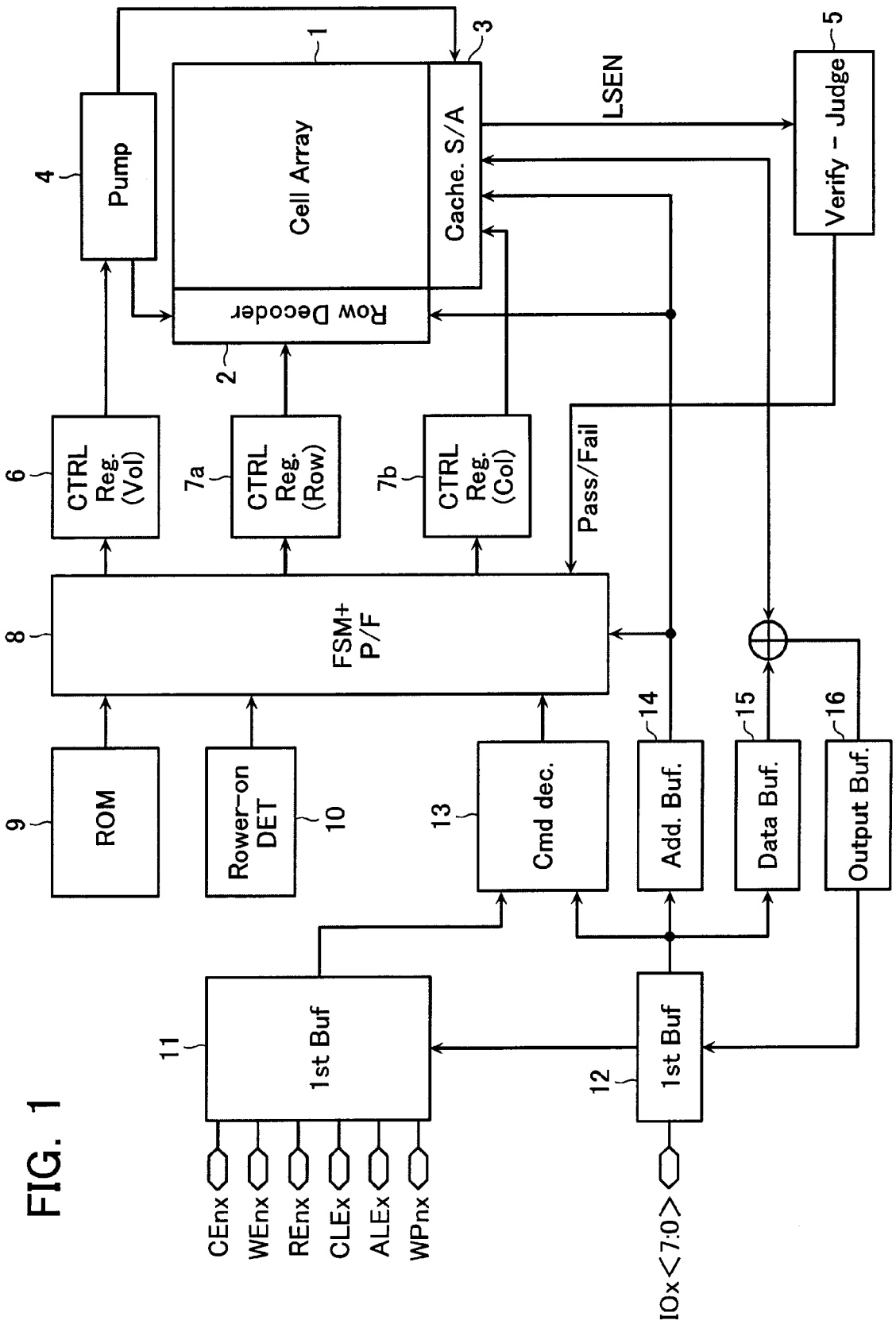
FIG. 1 shows a functional block configuration of a flash memory in accordance with an embodiment of the present invention.
Figure 2:
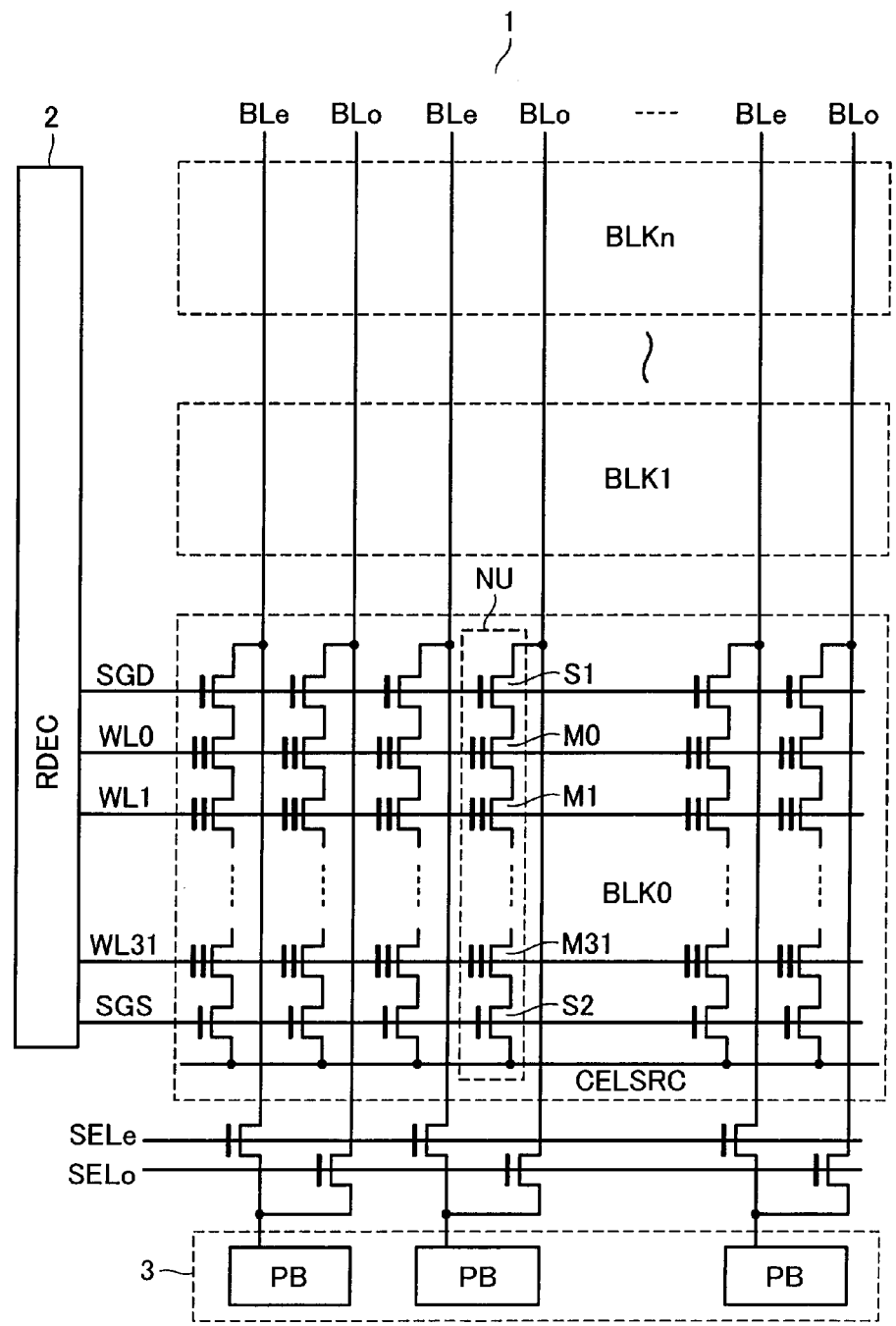
FIG. 2 shows a memory cell array of the flash memory.

FIG. 1 shows a functional block of a NAND-type flash memory in accordance with this embodiment; and FIG. 2 shows a cell array configuration of the memory core portion. The cell array 1 is formed of NAND cell units NU (NAND strings) arranged therein, each of which has a plurality of (thirty two in this example) electrically rewritable and non-volatile memory cells M0-M31 connected in series.

One end of the NAND cell unit NU is coupled to a bit line BLe or BLo via a select gate transistor S1; and the other end to a common source line CELSRC via another select gate transistor S2. Control gates of the memory cells M0-M31 are coupled to word lines WL0-WL31, respectively; and gates of the select gate transistors S1 and S2 to select gate lines SGD and SGS, respectively.

A set of NAND cell units arranged in the direction of the word line is defined as a block, which serves as a data erase unit. As shown in FIG. 2, multiple blocks BLK0-BLKn are arranged in the direction of the bit line.

Disposed on one end of the bit line BLe, BLo is a sense amplifier circuit 3 serving for reading/writing cell data while disposed at one end of the word line is a row decoder 2 serving for selectively driving the word lines and select gate lines. In the example shown in FIG. 2, one of the even bit lines BLe and odd bit lines BLo, which are disposed adjacent to each other, are selected via a bit line select circuit to be coupled to the respective sense amplifiers PB in the sense amplifier circuit 2.

Command, address and data are input via input buffer 12 while external control signals such as chip enable signal CEnx, write enable signal WEnx, read enable signal REnx and the like are input via input buffer 11. Command is decoded in command decoder 13 and transferred to state machine 8 serving as an internal controller.

Control program of the state machine 8 is stored in ROM circuit 9 partly or as a whole. At a power-on time, when the power-on detecting circuit 10 detecting the power-on, the control program in the ROM circuit 9 is read out and transferred to the state machine 8, thereby serving for controlling various operations.

Address is transferred to the row decoder and column gate via address buffer 14, and via control registers 7a and 7b. Write data is loaded in the sense amplifier 3 via data buffer 15 while read data in the sense amplifier 3 is output to the external via data buffer 16.

To generate various high voltages required for various operations, there is provided a high voltage generation circuit 4, which generates high voltages under the control of the state machine 8 via control register 6.

Disposed to be attached to the sense amplifier circuit 3 is verify-judge circuit 5, which executes verify-judgment based on data stored in data latches in the sense amplifier circuit 3 at a data write time. State machine 8 monitors the PASS/FAIL flag output from the verify-judge circuit 5 so as to perform write sequence control.

Detection line LSEN shown in FIG. 1 is practically disposed on the area of the sense amplifier circuit 3. As described above, the detection line LSEN is disposed to cross the sense amplifier circuit 3, and it causes erroneous judgment of the verify-judge circuit 5. In this embodiment, the verify-judge circuit 5 is formed to be able to avoid the above-described erroneous judgment. The details will be explained later.

Figure 3:
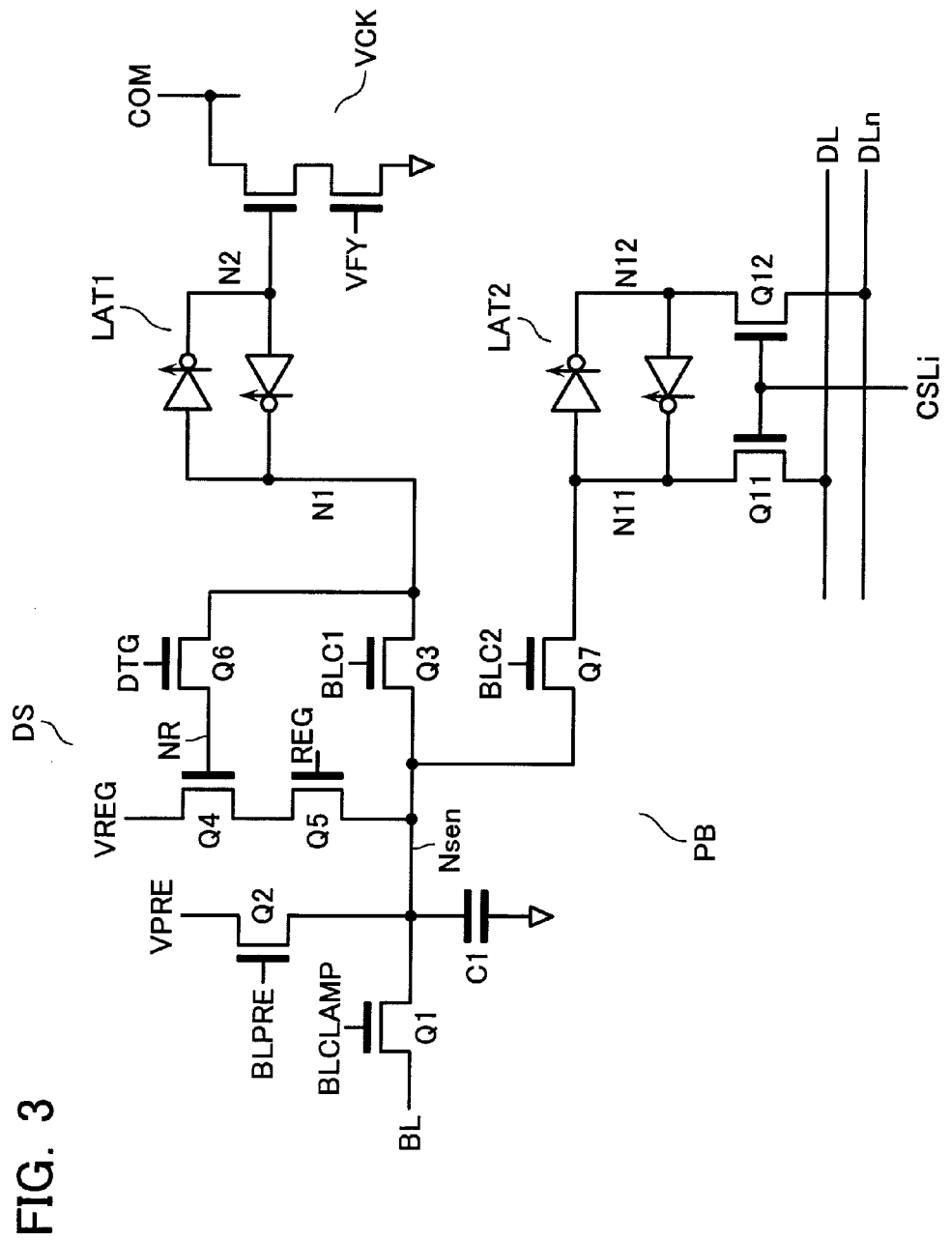
FIG. 3 shows a sense amplifier of the flash memory.

FIG. 3 shows a detailed configuration of a sense amplifier PB in the sense amplifier circuit 3. NMOS transistor disposed between sense node Nsen and bit line BL serves for clamping the bit line precharge voltage and serves as a pre-sense amplifier for amplifying the bit line voltage. Precharge NMOS transistor Q2 also is coupled to the sense node Nsen, and if necessary, charge storing capacitor C1 is coupled to the sense node Nsen.

Sense node Nsen is coupled to one data node N1 of data latch LAT1 via transfer NMOS transistor Q3. Disposed between data node N1 and sense node Nsen is data storage circuit DS, which temporally stores read data. The gate of NMOS transistor Q4, the drain of which is coupled to voltage node VREG, serves as a data storage node NR. Between this data storage node NR and data node N1, transfer NMOS transistor Q6 is disposed. To transfer the voltage at node VREG to sense node Nsen in accordance with data stored at the data storage node NR, NMOS transistor Q5 is disposed between NMOS transistor Q4 and sense node Nsen.

The data storage circuit DS serves as a write back circuit, which is used to store the write data at the last cycle, and write-back "0" data to data latch LAT1 only when "0" write is insufficient. In other words, it will be controlled that data latches LAT1 becomes all "1" state (i.e., all "H" state of data nodes N1) when the whole bits in a selected page have been written.

Further coupled to sense node Nsen via transfer NMOS transistor Q7 is another data latch LAT2, which serves as a data cache. Data nodes N11 and N12 of data latch LAT2 are coupled to complementary data lines DL and DLn via column select gate Q11 and Q12, which are driven by column select signal CSLi.

FIGS. 7A to 7D show column arrangement examples adapted to one page. One page is defined by such a range of memory cells that data write or read is performed at a time. In detail, in the cell array shown in FIG. 1, a set of memory cells selected by a word line and the entire even bit lines, or a set of memory cells selected by a word line and the entire odd bit lines is defined as one page.

Figure 7A:
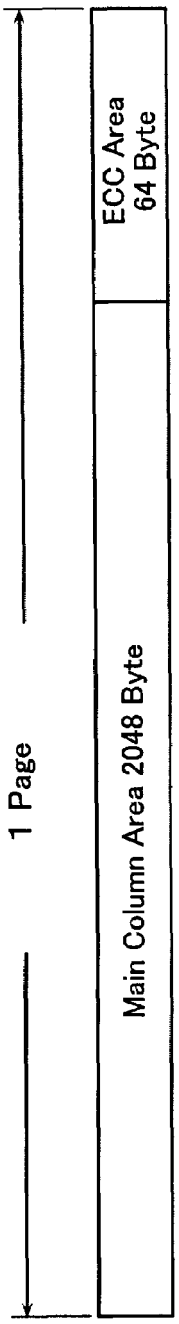
FIG. 7 shows page configuration examples in the flash memory.

In the example shown in FIG. 7A, one page contains a main column area of 2048 Byte and an ECC area of 64 Byte. Practically, another redundant column for redundancy and other additional columns may be prepared in accordance with applications.

Figure 7B:
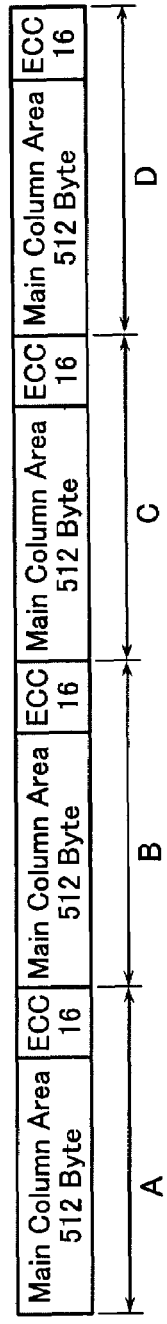

FIG. 7B shows such an example that one page is divided into four areas A, B, C and D, each of which contains a main column area of 512 Byte and an ECC area of 16 Byte used for correcting an error(s) in the corresponding main column area. In this embodiment, this page configuration is used, and verify-judge at a write/erase time is sequentially executed for four areas A, B, C and D.

Figure 7C:
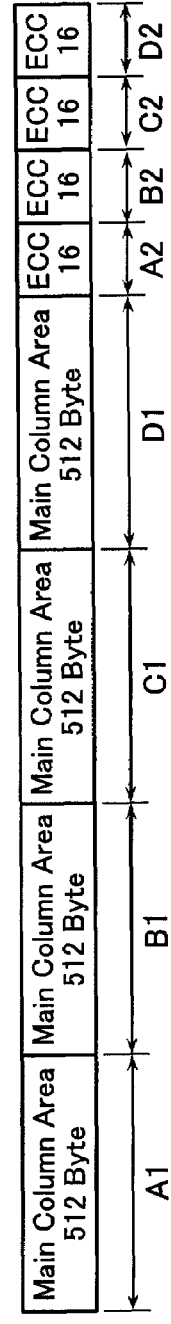
Figure 7D:
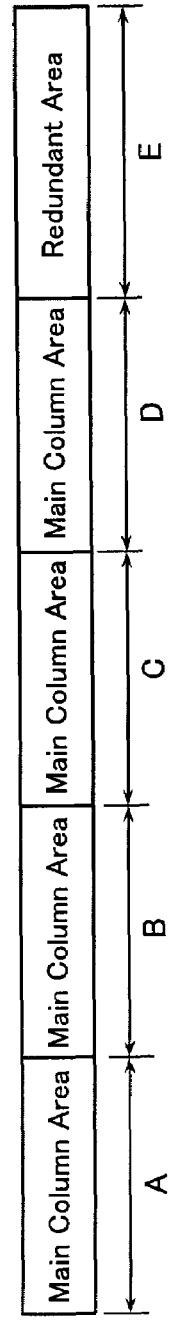

FIG. 7C shows such an example that four main column areas A1, B1, C1 and D1, and four ECC areas A2, B2, C2 and D2 storing code data used for error correcting are arranged at the former half portion and the latter half portion, respectively, in one page. FIG. 7D shows an example, which contains four main column areas A, B, C and D to be successively arranged and a redundant area including ECC areas.

Figure 4:
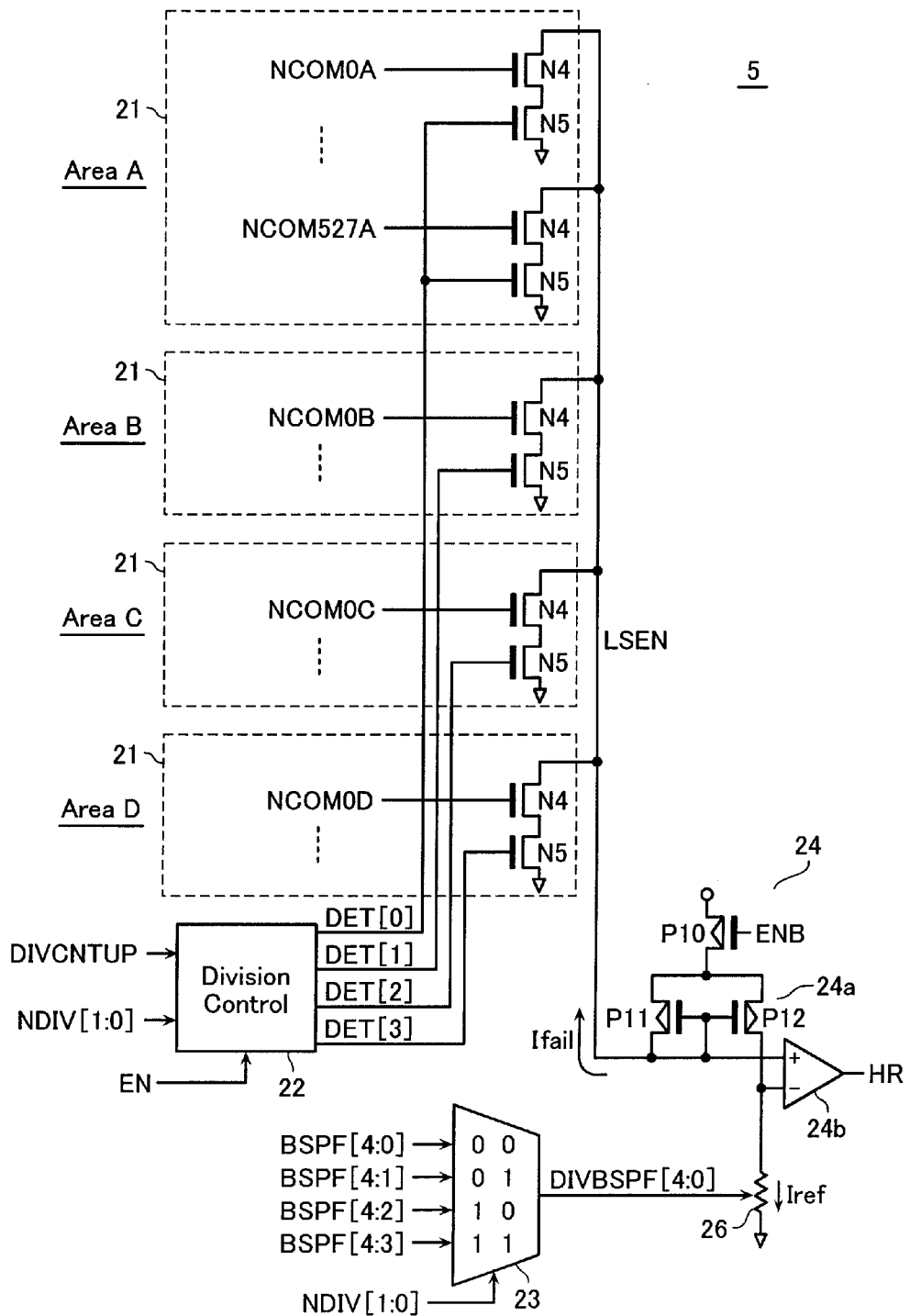
FIG. 4 shows a verify-judge circuit used in the flash memory.
Figure 5:
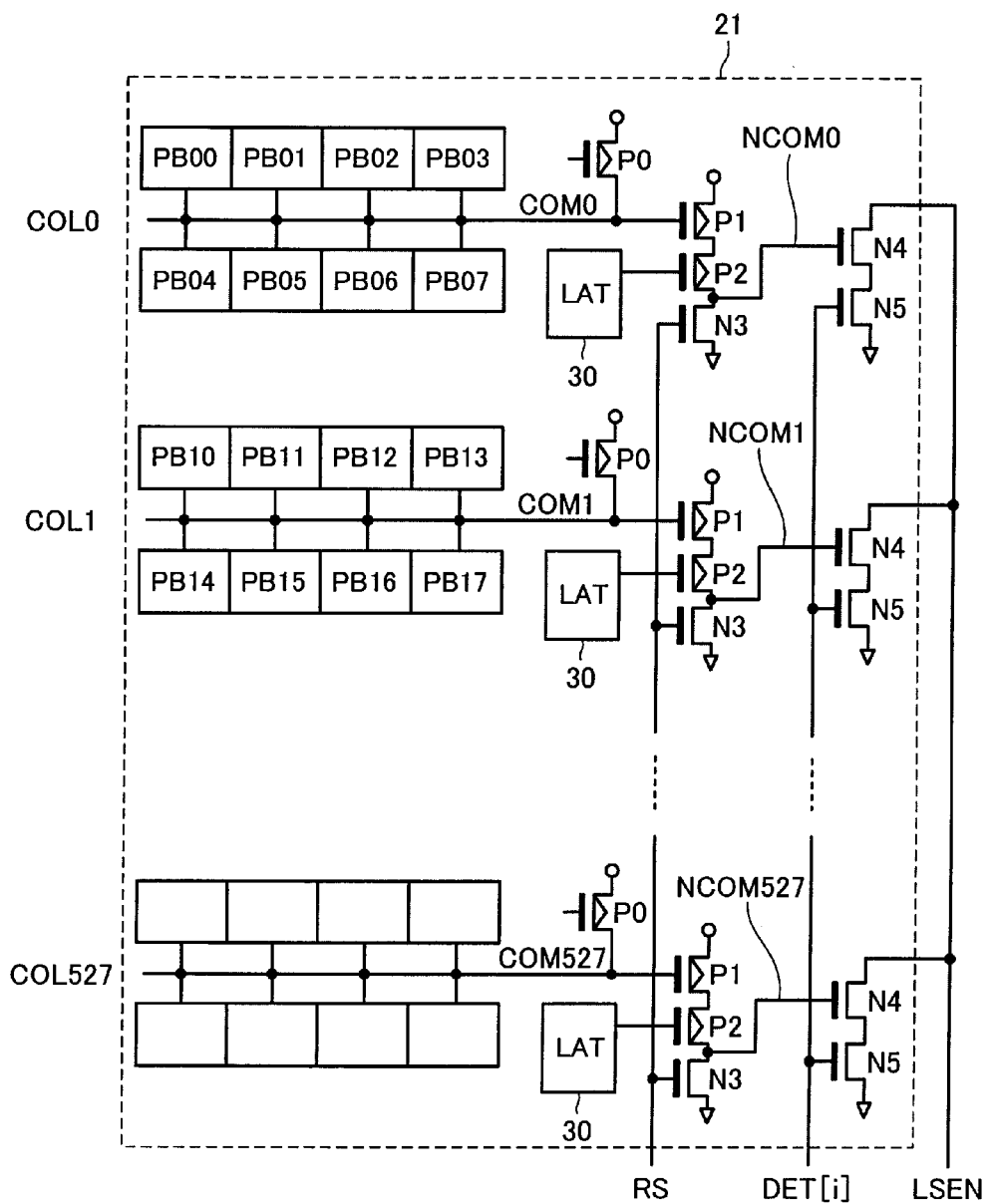
FIG. 5 shows the detection circuit used in the verify-judge circuit.

FIGS. 4 and 5 show a detailed example of the verify-judge circuit 5 on the condition of the page arrangement shown in FIG. 7B. This circuit has such a hierarchic detection line structure that first detection lines COM (COM0, COM1, . . . , COM527), second detection lines NCOM (NCOM0, NCOM1, . . . , NCOM527) and a third detection line (i.e., collective detection line) LSEN are prepared for verify-judging.

The first detection lines COM are disposed, as shown in FIG. 5, for every Byte (i.e., every column) for judging the data state of data latches LAT1 of eight sense amplifiers PB.

The second detection lines NCOM are disposed in one-to-one correspondence with the first detection lines COM to detect the level transition of the first detection lines COM at normal columns. The third detection line LSEN is a final detection line (i.e. collective detection line) for detecting the level transition of the second detection lines NCOM of 528 columns for the respective areas.

Explaining in detail, each of the first detection lines COM is disposed to be coupled to 1 Byte sense amplifiers PB. Further in detail, as shown in FIG. 6, each detection line COM is coupled to data latches LAT1 for storing verify-read data in eight sense amplifiers PB via check circuits VCK.

At the verify-read time of data write or erase, the data stored in data latches LAT1 are controlled to be in an all "1" state when write is completed. The first detection lines COM are for detecting the above-described all "1" state for every column.

The first detection line COM is precharged at Vdd via precharge PMOS transistor P0. If at least one of latches LAT1 stores data "0" (write insufficient) when the verify-check circuit VCK is activated by verify signal VFY, the first detection line COM, which has been precharged, is discharged to notice that the write or erase is "FAIL", i.e., write or erase has not yet been completed.

Figure 6:
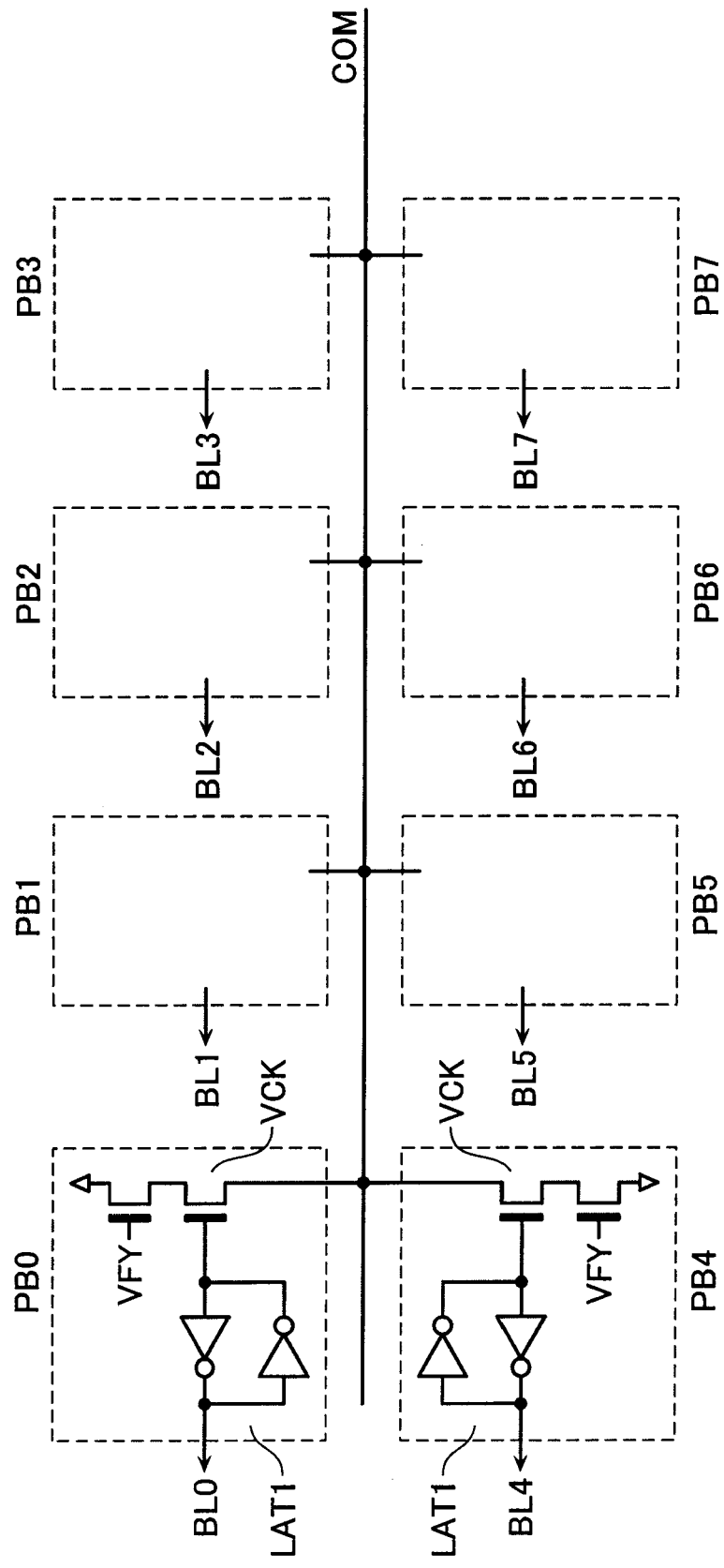
FIG. 6 shows the connection state of detection line COM in the verify-judge circuit.

In FIG. 6, for example, it will be so formed that verify-signal VFY activates the entire data latches LAT1 in eight sense amplifiers PB simultaneously. This is such a case that PASS/FAIL is to be judged by a column. However, in case PASS/FAIL is to be detected by a bit, the verify signal VFY will be sequentially input to sense amplifiers PB to check repeatedly.

Selecting the connection of the verify signal VFY, it will be formed to judge whether the number of fail columns in one page is under a permissible value or not, or whether the number of fail bits is under another permissible value or not.

The first, 528, detection lines COM are coupled to the respective gates of PMOS transistors P1 for detecting level transition thereof. The sources of PMOS transistors P1 are coupled to Vdd; and the drains to the second detection lines NCOM via PMOS transistors P2, which are driven by data latches 30 storing column isolating data. The second detection lines NCOM are coupled to ground potential node Vss via reset NMOS transistors N3.

The column isolating data is for excluding, for example, defective columns and the like from the verify-judging targets. Therefore, it is such data as to make PMOS transistor P2 on at a normal column. Turning on the reset NMOS transistor N3 driven by reset signal RS, the second detection line NCOM will be reset at Vss.

At the verify-judging time, if either one of the first detection lines COM is changed to be in a "L" level, the corresponding PMOS transistor P1 becomes on, and PMOS transistor P2 is on at a normal column. On this condition, the second detection line NCOM is charged up via PMOS transistors P1 and P2. By contrast, at a bad column, PMOS transistor P2 is off. Therefore, the second detection line NCOM is kept at the initial "L" level state as regardless of the level transition of the first detection line COM.

The second detection lines NCOM are coupled to the respective gates of NMOS transistors N4 for detecting the level transition thereof. Drains of NMOS transistors N4 are coupled in common to the third detection line LSEN. The sources of NMOS transistors N4 are coupled to the ground potential (Vss) node via NMOS transistors N5, which are for selecting the areas.

As shown in FIG. 4, fail detection circuits 21 are disposed in correspondence to four areas A, B, C and D, each of which has the second, 528, detection lines NCOM, and controlled by division control circuit 22 to be sequentially activated one by one. That is, in this embodiment, the division control circuit 22 generates selection signals DET[0]-[3] in response to divisional number determining signal NDIV, thereby sequentially on-driving area selection transistors N5 in the four fail detection circuits 21.

If the second detection line NCOM is changed to be "H", and NMOS transistor N4 is turned on in a certain detection circuit 21, current Ifail flows on the third detection line LSEN. This current Ifail is one corresponding to the number of fails to be detected, and therefore it will be referred to as fail current hereinafter. In other words, in FIG. 5, NOR logic is taken between the first detection line COM and the output of latch 30, and the result is transferred to the second detection line NCOM. NMOS transistors N4 are turned on in correspondence with the number of "L" level transitions of the second detection lines NCOM, i.e., fail numbers, and fail current Ifail flows on the third detection line LSEN in correspondence with the fail numbers.

To compare the fail current Ifail on the third detection line LSEN with a reference current Iref of a reference current source 26, and judge FAIL/PASS, a current comparison circuit 24 is prepared. This current comparison circuit 24 has PMOS current mirror circuit 24a and comparator 24b. PMOS current mirror circuit 24a includes activation PMOS transistor P10, which is driven by activation signal ENB.

The drain of PMOS transistor P11 in the current mirror circuit 24a is coupled to the third detection line LSEN while the drain of PMOS transistor P12 is coupled to the input node of the comparator 24b and the reference current source 26. The reference current source 26 is such a variable current source that the reference current Iref is selectable in response to instruction signal DIVBSPF[4:0].

Assume that PMOS transistors P11 and P12 have the same size. When Ifail flows on the third detection line LSEN, PMOS transistor P12 will carry the same current. If the fail current Ifail is less than the reference current Iref, the comparator 24b outputs judging signal HR="H" (i.e., PASS) while if Ifail is larger that Iref, HR="L" (i.e., FAIL) is output.

To set the reference current Iref of the reference current source 26, permissible fail number setting circuit 23 is prepared. This circuit 23 selects one of four permissible fail number instruction signals BSPF[4:0] to BSPF[4:3] based on division number determining signal NDIV[1:0] to output reference current determining signal DIVBSPF[4:0], which instructs the reference current Iref of the reference current source 26.

In detail, the reference current determining signal DIVBSPF[4:0] is transferred as a result of that the fail number instruction signal BSPF[4:0] designating the permissible fail numbers in a page is divided by the division number determining signal NDIV[1:0]. For example, in case the whole permissible fail numbers are 8 columns (or 8 bits) in one page (2048+64 Byte), the permissible fail number in each of four areas will be calculated to be two via the following division: the whole permissible numbers are divided by the area numbers. In other words, the reference current Iref is set to satisfy such a condition that Ifail is less than Iref (i.e., HR="H" is output) until the number of fails becomes 2.

Figure 8:
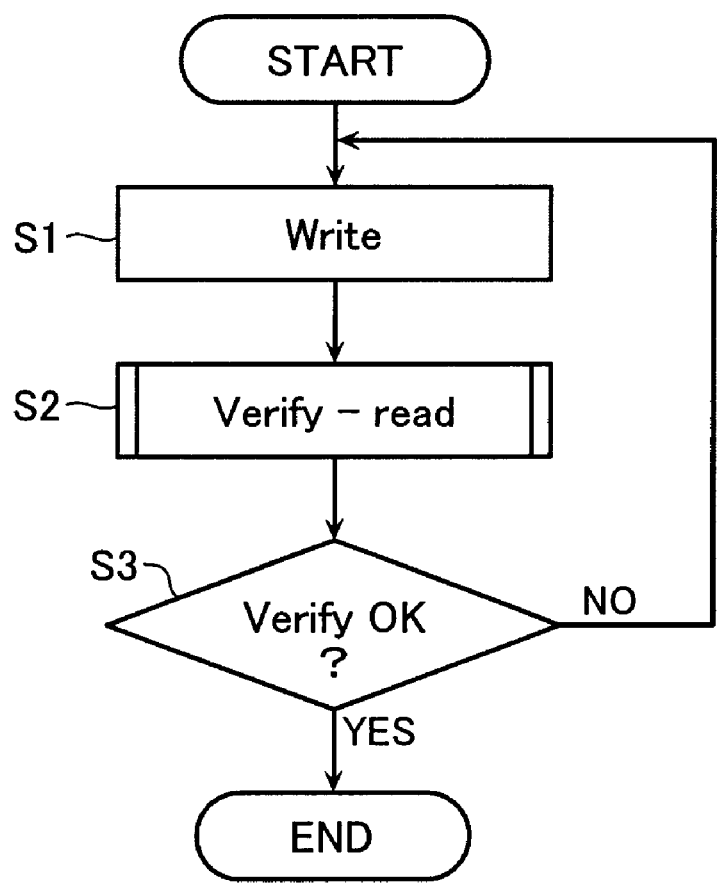
FIG. 8 shows a write sequence of the flash memory.

FIG. 8 shows a basic write sequence in this embodiment. Data write is performed by repeat of write step S1 and verify-read step S2 for verifying the write state. If write completion is judged at verify-judge step S3, the write sequence ends.

Figure 9:
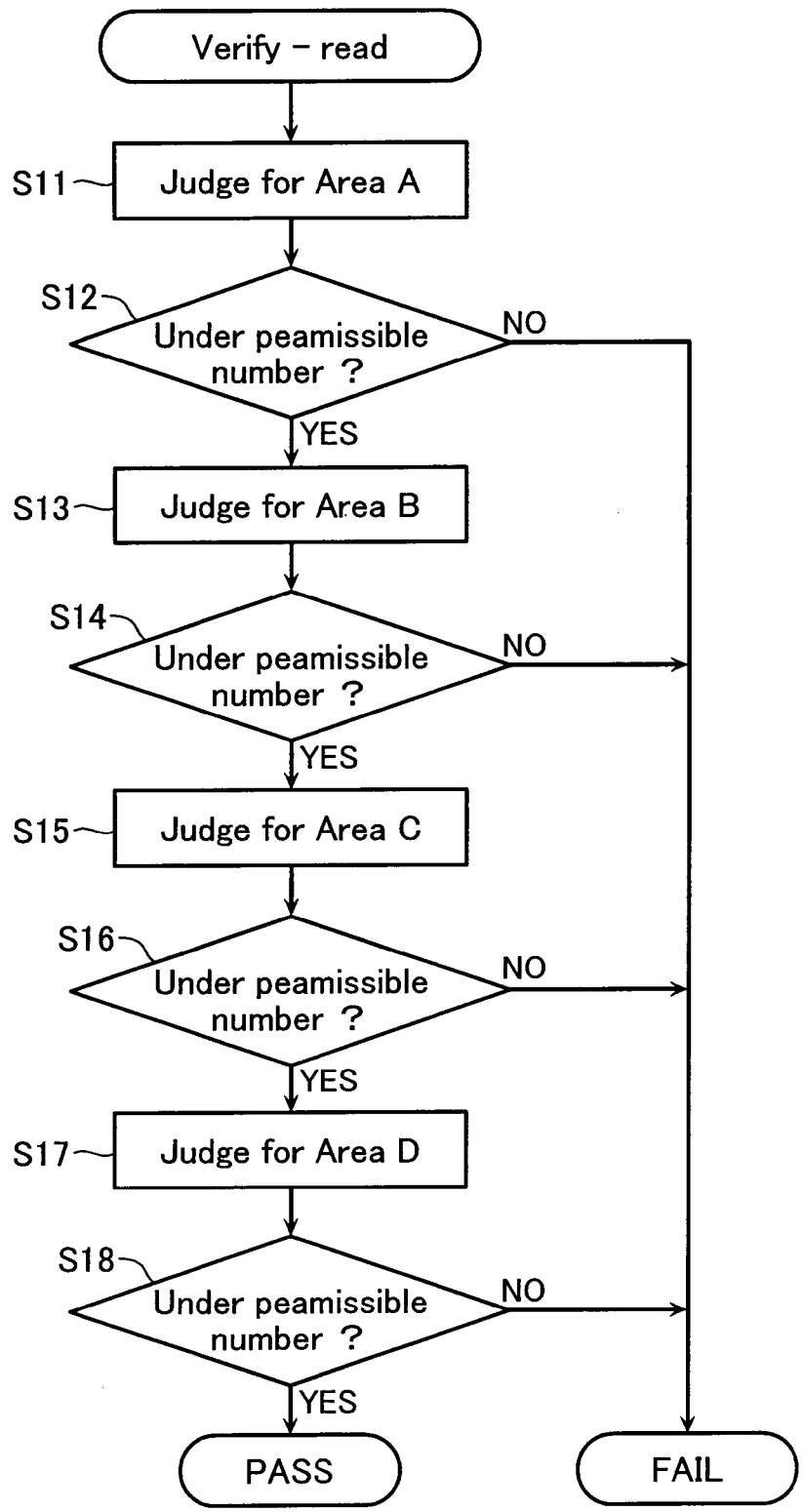
FIG. 9 shows a verify-read sequence of the flash memory.

In the verify-read step S2 in this embodiment, as shown in FIG. 9, one page verify-read is performed, and then based on the verify result, verify-judgments for four areas are sequentially performed as follows. At step S11, verify-judgment is performed for area A, and it is judged whether the fail number is under the permissible value or not (step S12). If YES, next verify-judgment is performed for area B (step S13), and it is judged whether the fail number is under the permissible value or not (step S14).

Similarly, under the condition that the fail number is under the permissible value, verify-judgment and the fail number judgment will be repeated for areas C and D (steps S15-S18).

Figure 10:
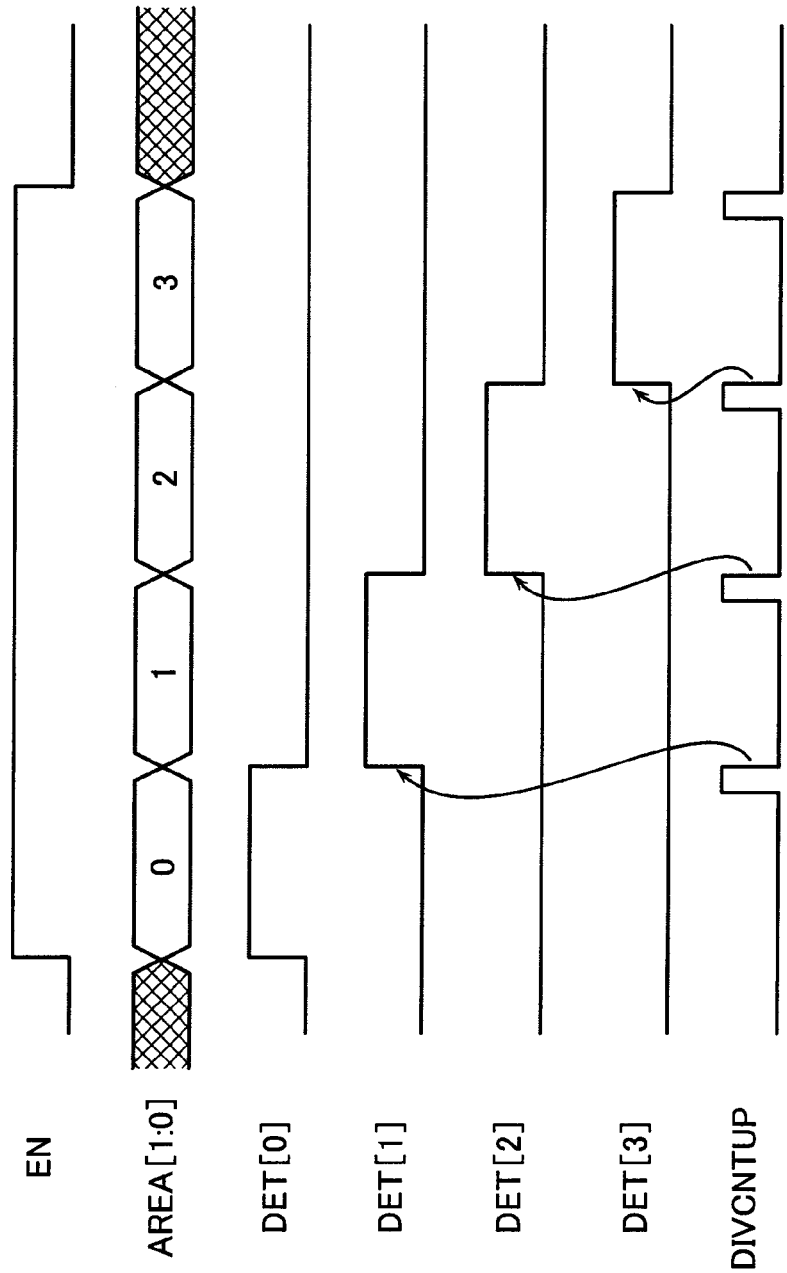
FIG. 10 shows a timing chart for explaining the fail detection operation with the verify-judge circuit.

FIG. 10 shows a timing chart of the above-described verify judgment. Area selection signal AREA[1:0] is generated in the division control circuit 22 for distinguishing between the four areas A to D. At the detection time, activation signal EN is set to be "H". Initially, selection signal DET[0] becomes "H" for checking the area A while selection signals DET[1] to DET[3] for checking other areas are kept at "L".

In this state, it is detected whether the second detection lines NCOM0-NCOM527 are changed in level or not in the area A. The reference current source 26 is set to carry a certain reference current Iref in response to the signal DIVBPSF[4:0] instructing that the fail number is 2.

After finishing the check of area A, selection signal DET[0] is made inactive, and in place of it, selection signal DET[1] is made active. In response to it, area B is checked. At this time, it will be used the same reference current Iref as in case of the area A. Similarly, areas C and D are sequentially checked in the same way as described above, so that the whole areas will be checked.

Judging signal HR output as a result of the verify-check for every area or the whole areas is noticed to the state machine 8 to be used for judging the condition of the following operation such as an additional write executed for example when the verify result is "FAIL".

According to the verify-judge circuit in accordance with this embodiment, it becomes possible to exchange the division numbers and division areas for verify-checking in the chip in accordance with the data areas defined by a user's system and the ability of the fail number detecting circuit. Explaining in detail, for example, by use of photo-mask change (i.e., master-slice) or a combination between a register and laser blowing fuse, one time program fuse or ROM fuse, a desirable division number will be set.

According to the above-described embodiment, the collective write unit (one page) is divided into multiple areas, and the fail number check will be performed for every area. Therefore, in case the page length is increased or the permissible fail number is increased, it becomes possible to avoid the erroneous verify-judgment due to the wiring resistance increase of the detection lines and the like. Additionally, it is possible to avoid drawbacks generated on the device fabrication and on the device application.

Note here that the permissible fail number is always set to be a multiple of the division number N of one page in the fail detection scheme shown in the above-described embodiment. For example, in case the division number is 4, the permissible fail number in each area is an integer such as 0, 1, 2 and the like, therefore only multiple thereof such as 0, 4, 8 and the like is useful as the total permissible number of one page.

Additionally, this embodiment may be effective in such a case that fail bit (fail Byte) generation in a page is statistically random. However, in case fails are systematically generated, for example, in case there are columns where defects are easily generated due to cell array arrangement, this embodiment is not useful.

Embodiment 2

Figure 11:
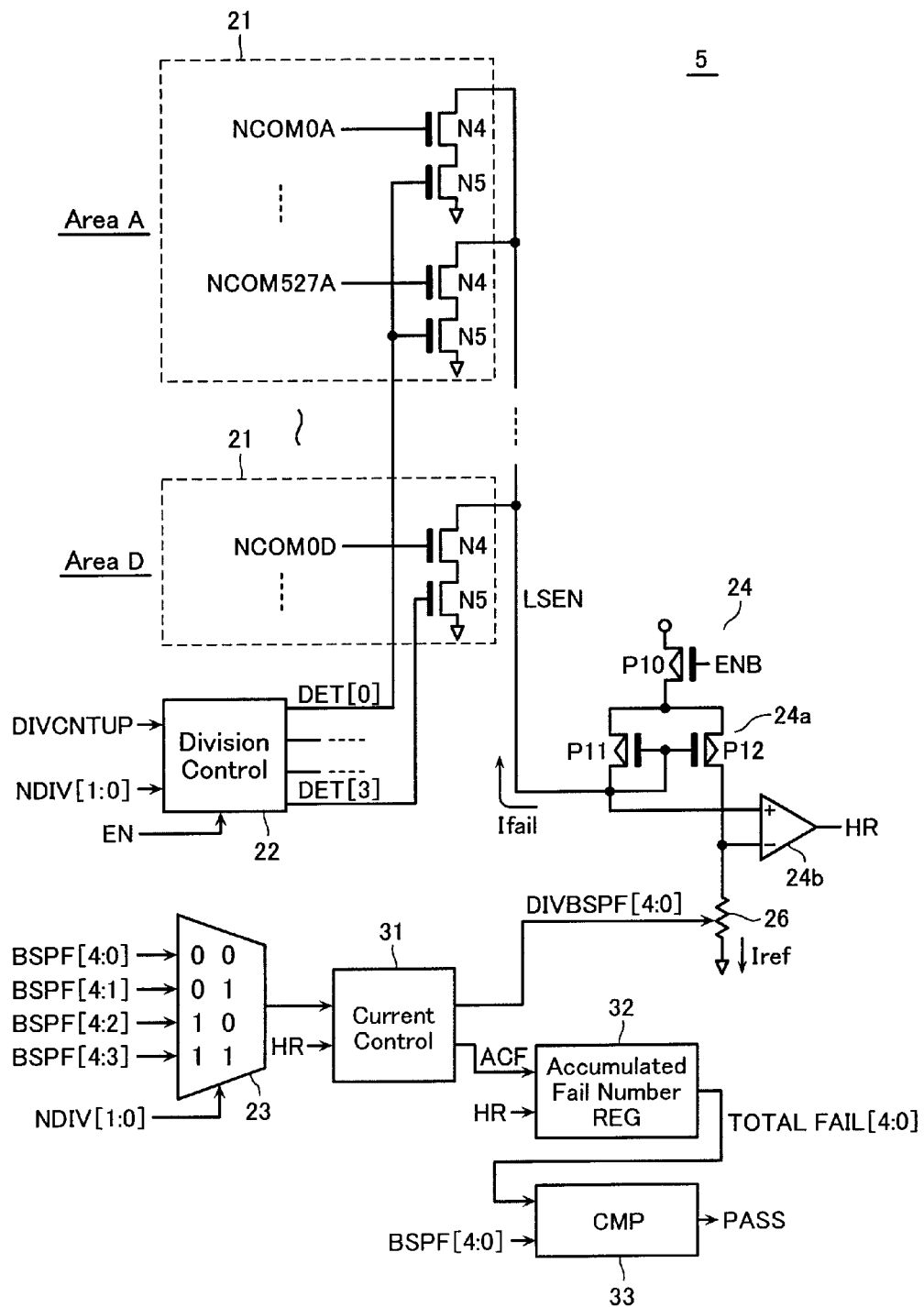
FIG. 11 shows a verify-judge circuit of a flash memory in accordance with another embodiment.

FIG. 11 shows verify-judge circuit 5 in accordance with another embodiment, in which the total permissible fail number may be set independently from the area division number, in comparison with FIG. 4. For the same portions and signals as in FIG. 4, the same reference numbers and symbols are used as in FIG. 4, and the detailed explanation will be omitted.

In this embodiment, reference current control circuit 31 is disposed at the output node of the permissible fail number setting circuit 23 to output signal DIVBSPF[4:0], by which the reference current is determined. The reference current control circuit 31 further outputs signal ACF for instructing a binary code value corresponding to the permissible fail number in the corresponding check area. To receive the signal ACF, accumulated fail number register 32 is disposed.

Figure 12:
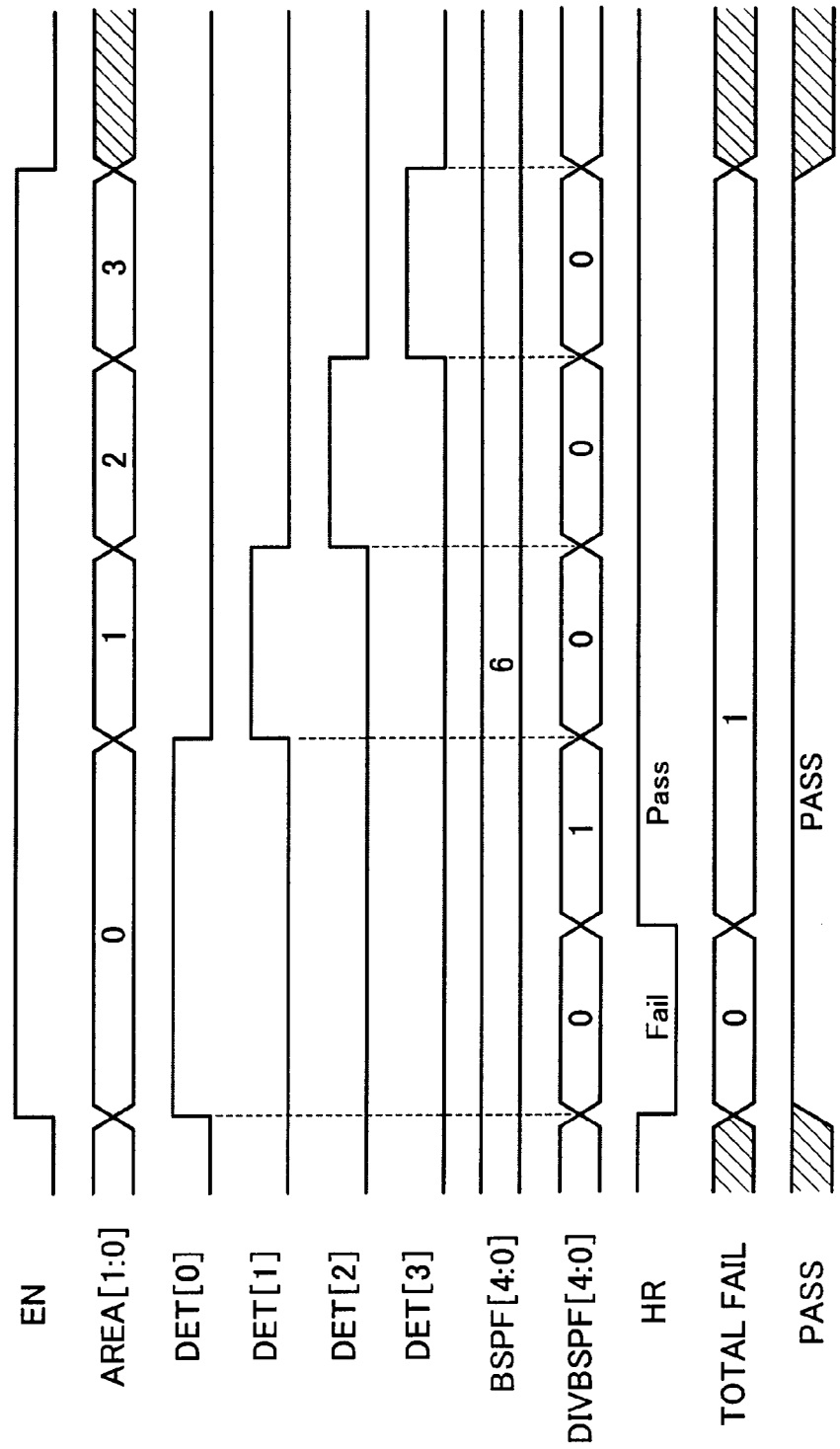
FIG. 12 shows a timing chart for explaining the fail detection operation in the embodiment.

FIG. 12 is a verify-judging timing chart in this embodiment, which shows such a case that one page is divided into four areas as well as the above-described embodiment, and the total permissible fail number for one page is set to be six. In the detailed example shown in FIG. 12, there is one fail in area A while there are no fails in the others, therefore total fail numbers are under the permissible value.

While the activation signal EN is "H", verify-check operations will be executed. To check the area A at the initial time, selecting signal DET[0] is activated. The permissible number in the area A, that is a quotient obtained by dividing the total permissible fail number by the area number, starts from such a value that decimals thereof are raised.

In detail, in this embodiment, since the total fail number of a page is 6, and area division number is 4, the permissible fail number for checking each area may be started from 0 or 1. Since the example shown in FIG. 12 starts from 0, and there is one fail in the area A, the judging signal HR becomes "L" (FAIL) at the initial judging time.

After noticing this fail state, the reference current control circuit 31 takes a necessary time and then executes such a control as to add +1 to the binary value of the signal DIVBSPF [4:0] instructing the permissible fail number for each area. As a result, the reference current Iref of the reference current source 26 is changed from the value corresponding to "permissible number=0" to another value corresponding to "permissible number=1".

In response to this permissible number change, it will be judged that the fail number of area A is under the permissible value in the example shown in FIG. 12. Therefore, the judging signal becomes HR="H" (PASS). In response to the judging result of area A, to check the following area B, output DIVBSPF[4:0] of the current control circuit 31 is set at the initial value. Division control circuit 22 makes DET[0] inactive, and makes DET[1] active. Operations to be executed hereinafter are the same as in the above-described embodiment.

In the example shown in FIG. 12, the verify-check result for the area B is HR="H" (PASS) because the permissible fail number is 0 while fail number is 0. Therefore, there is not used such an operation that the permissible fail number is changed. This is the same for the remaining areas.

An accumulated fail number obtained through verify-checking for ever area is stored in the accumulated fail number register 32. The accumulation result is output as a signal TOTAL FAIL[4:0] from the register 32. This result is transferred to the comparator 33, and is compared with the total permissible fail number of one page. The comparator 33 outputs "PASS" when the accumulated fail number obtained in each area is under the total permissible fail number, and outputs "FAIL" when it is not so.

In the example shown in FIG. 12, total fail number is 1, and the permissible fail number of a page is 6, it will be kept to continuously output "PASS". This result is transferred to the state machine 8 shown in FIG. 1.

Figure 13:
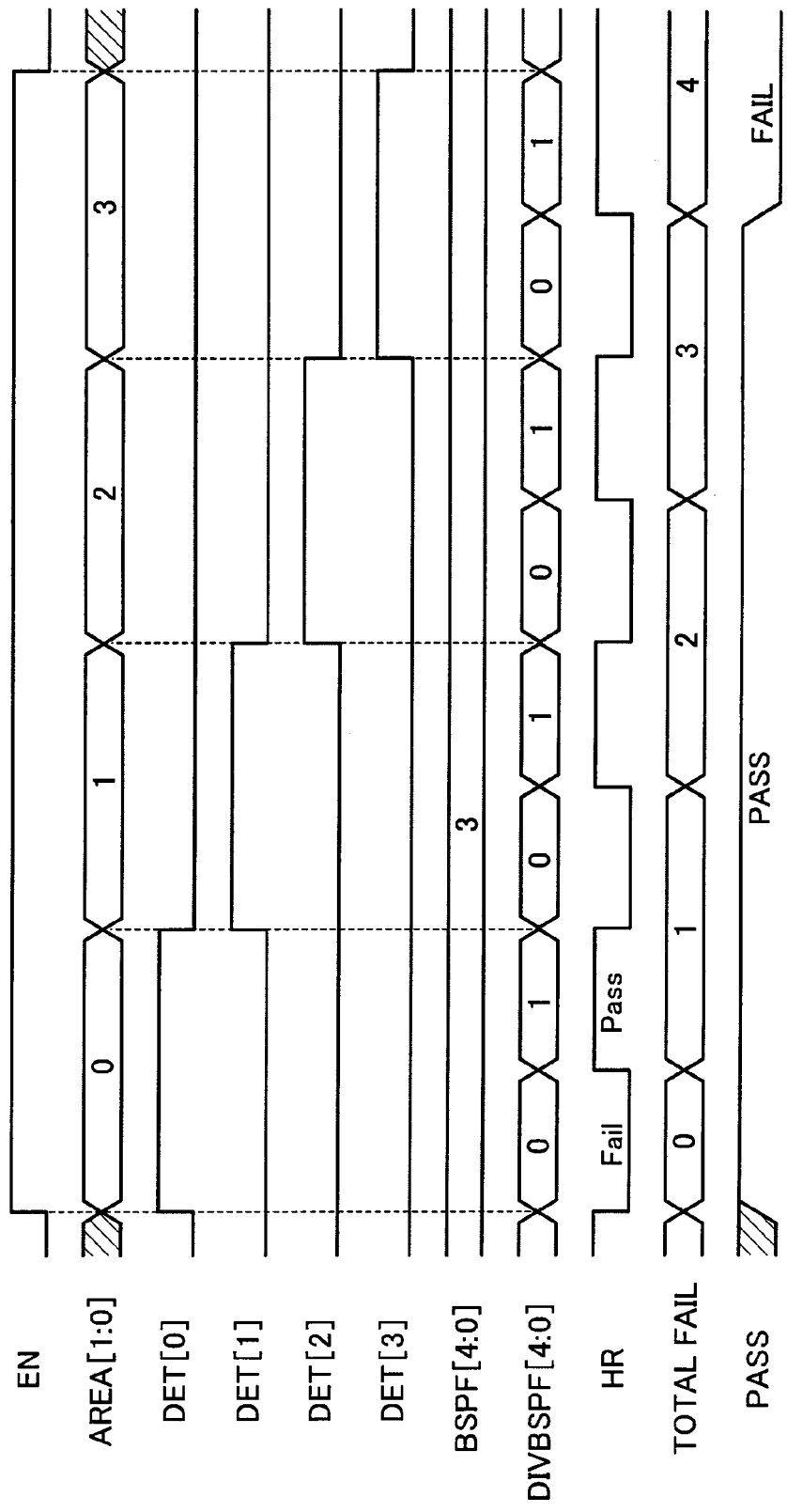
FIG. 13 shows another timing chart for explaining the fail detection operation in the embodiment.

FIG. 13 shows another example, in which the whole fails in a page are over the total permissible fail number. In detail, in this example, the total permissible fail number is set to be three (i.e., BSPF[4:0]=3), and there is one fail for each area from A to D.

The check method for each area is similar to that in the above-described example. The check for each area will be failed when the permissible fail number is 0, and passed when it is set to be 1. Therefore, when the check reaches area D, the output TOTAL FAIL of the accumulated fail number register 32 designates 4. At this time, since the accumulated fail number is over the total permissible fail number 3, the comparator 33 outputs "L" (FAIL).

According to this embodiment, it is possible to set the total permissible fail number of a page to be independent from the area division number.

Embodiment 3

The function of the division control circuit 22 shown in FIGS. 4 and 11 may be contained in the address buffer portion. Such an embodiment will be explained with reference to FIGS. 14 and 15.

Figure 14:
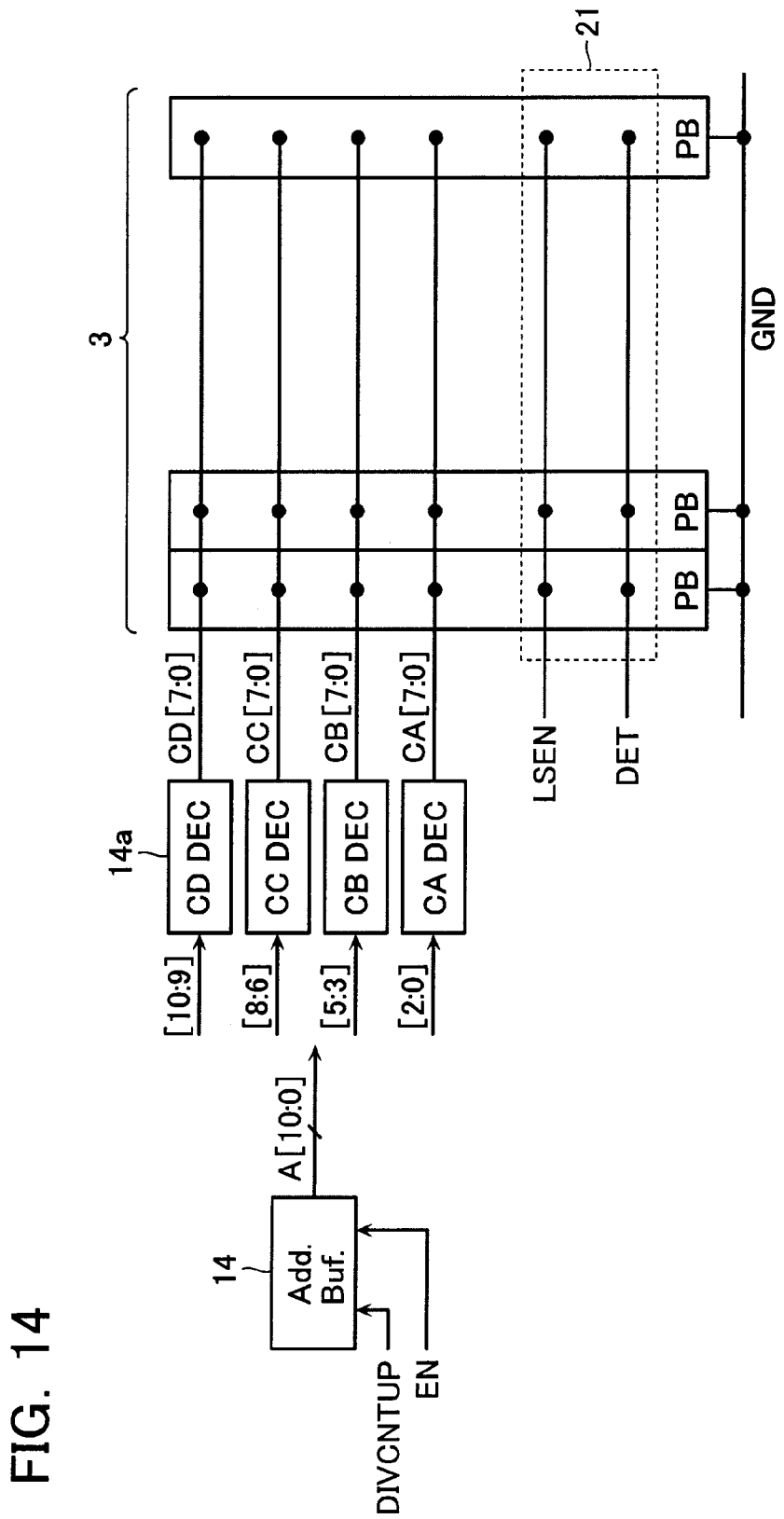
FIG. 14 is a diagram for explaining a division area selection scheme in a flash memory in accordance with another embodiment.

As shows in FIG. 14, collective detection line LSEN is disposed over the sense amplifier circuit area. Further disposed in parallel with each other over this area are signal lines of column address pre-decode signal CA, CB, CC and CD, which are decoded in column pre-decoder 14a.

Assuming that these pre-decode signals CA, CB, CC and CD serve for instructing the four areas A, B, C and D, respectively, in this embodiment, use these pre-decode signals for selecting the division areas. For example, in case CD[0] is activated, area A is selected as a check target; in case CD[1] is activated, area B is selected as a check target; in case CD[2] is activated, area C is selected as a check target; and in case CD[3] is activated, area D is selected as a check target is selected.

Figure 15:
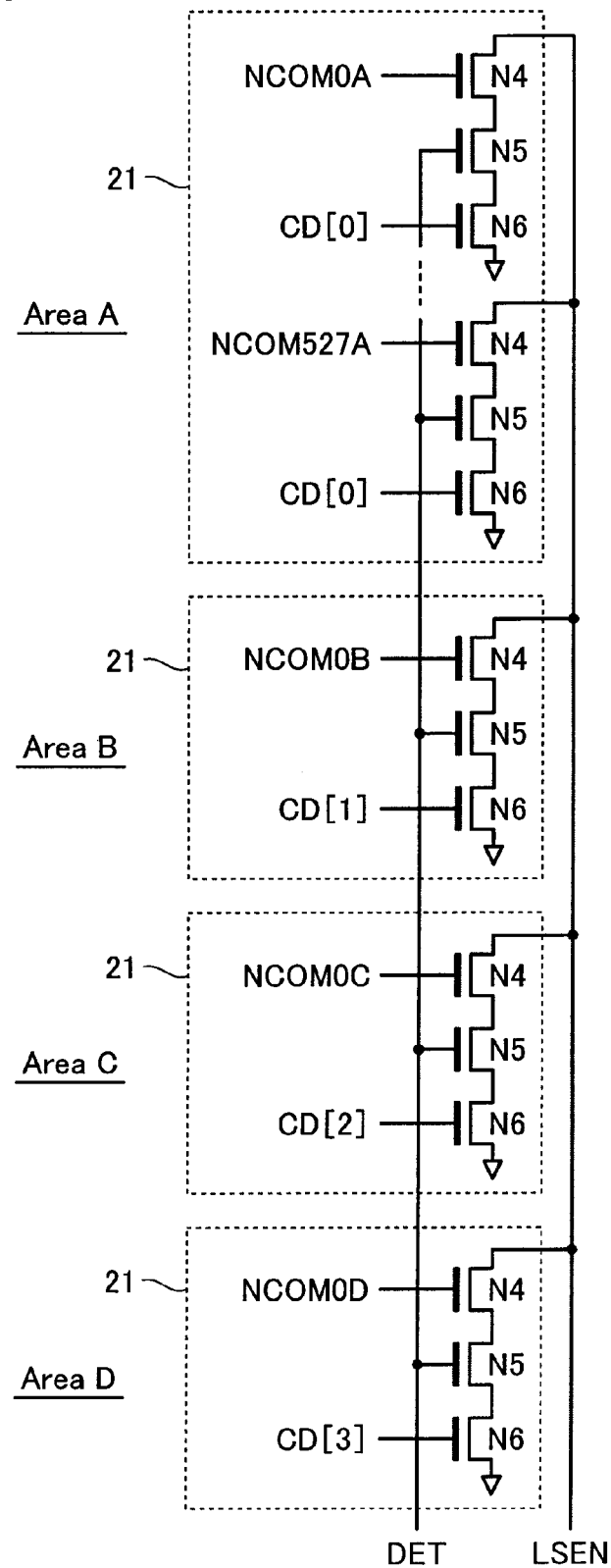
FIG. 15 is another diagram for explaining the division area selection scheme.

In detail, as shown in FIG. 15, in the fail number detecting circuit 21 for each area, NMOS transistor N5 and NMOS transistor N6 are coupled to NMOS transistor N4 in series. NMOS transistors N4 are driven by the respective second detection lines NCOM. NMOS transistors N5 are simultaneously driven by a common select signal DET prepared in common to all areas. NMOS transistors N6 are selectively driven by the respective pre-decode signals CD[0]-[3].

That is, NMOS transistors N5 are activation ones for activating simultaneously the entire detecting circuits 21 while NMOS transistors N6 serve as division area selecting ones.

Address buffer 14 includes means for initializing column address prior to verify-checking (not shown). In addition, the address buffer 14 has a function of holding column address, and incrementing it at every verify-judge time in accordance with activation signal EN and count-up signal DIVCNTUP.

By use of the above-described configuration, address pre-decode signals CD[0]-[3] may be used as area selecting signals used at the fail number judging times. Therefore, it is not required to dispose area select signal lines corresponding to area division numbers as in the above-described embodiments, but it is enough to dispose only one selecting line DET.

Although write-verify is explained in the above-described embodiments, the present invention may be adapted to erase-verify. Data erase is usually performed by a block. Verify-read at the erase time is so performed as to detect whether all cells in the entire NAND cell units become an erase state (negative threshold state) or not under the condition of all word lines being set at 0V in the erase block.

Erase completion may be judged similar to that at the write-verify time by detecting whether data latches LAT1 of one page become an all "1" state or not. Therefore, the verify-judge circuit 5 used in the above-described embodiments may be used in the erase mode as it is.

Although, in the above-described embodiments, write completion or erase completion has been performed based on the verify-read result, the present invention may be adapted to other applications. For example, one application is for checking data state in the cache data latches LAT2 in the sense amplifier circuit, in which one page data are loaded. In detail, in case one page data area is divided into multiple areas, it may be detected how many "0" data are there or how many "1" data are there in each division area with the same scheme used in the above-described embodiments.

[Application Devices]

As an embodiment, an electric card using the non-volatile semiconductor memory devices according to the above-described embodiments of the present invention and an electric device using the card will be described bellow.

Figure 18:
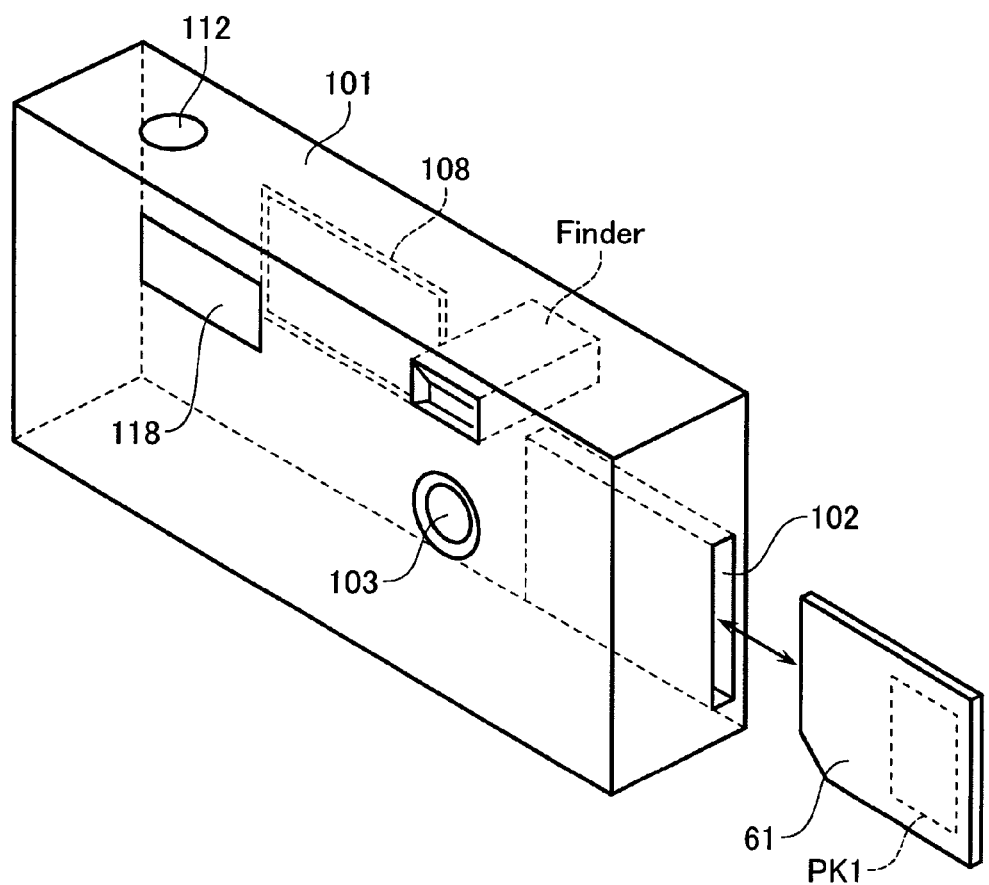
FIG. 18 shows another embodiment applied to a digital still camera.

FIG. 18 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 19:
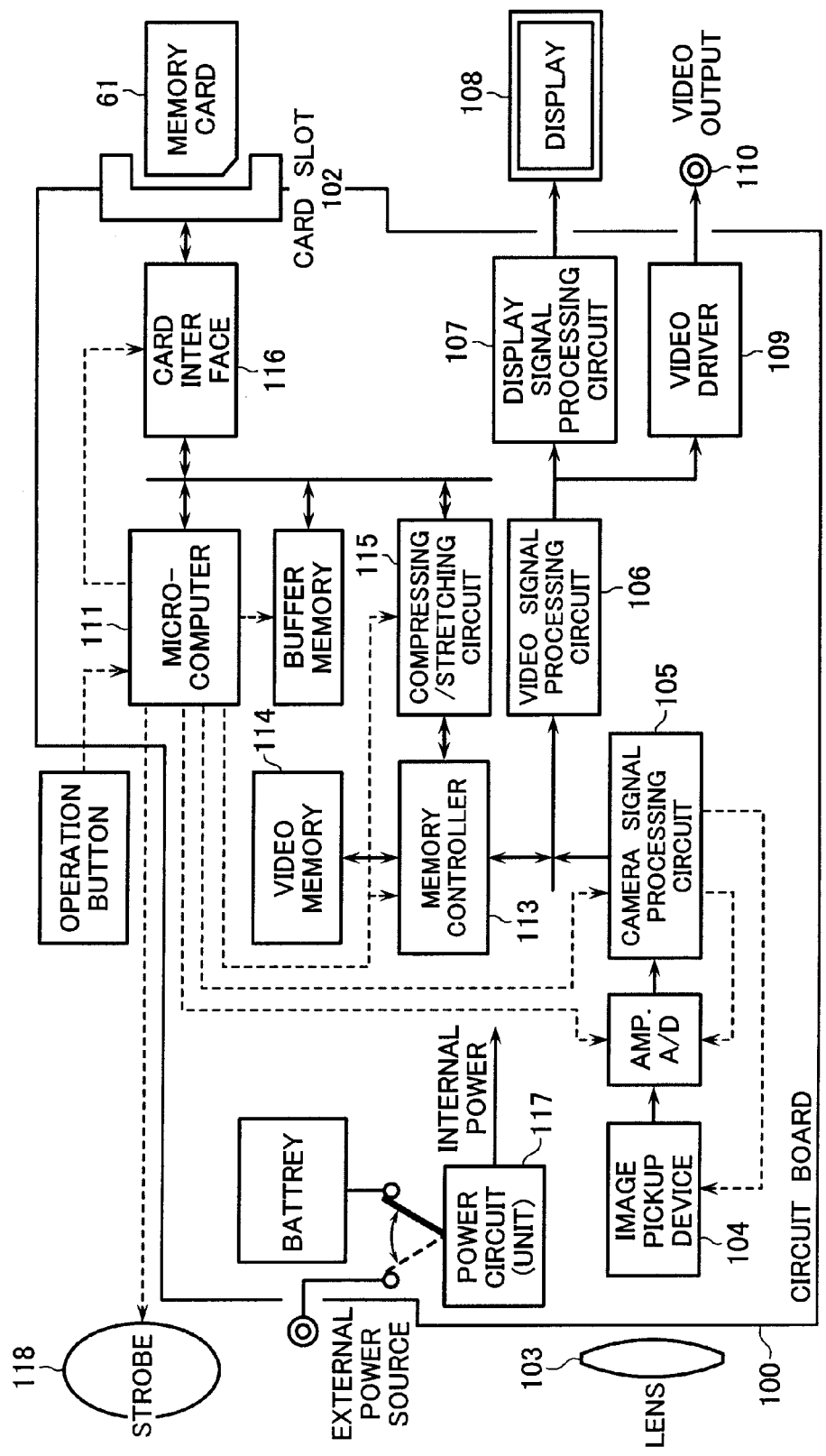
FIG. 19 shows the internal configuration of the digital still camera.
Figure 20A:
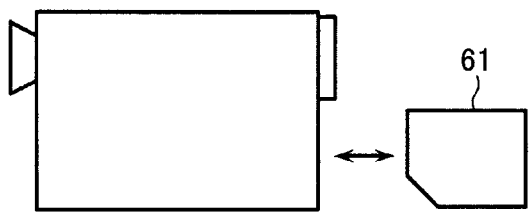
FIGS. 20A to 20J show other electric devices to which the embodiment is applied.
Figure 20B:
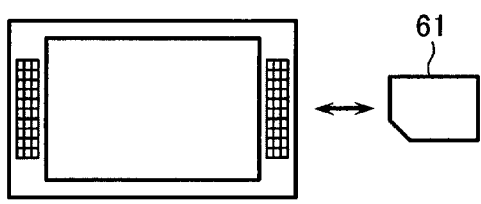
Figure 20C:
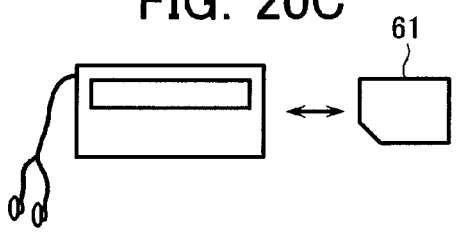
Figure 20D:
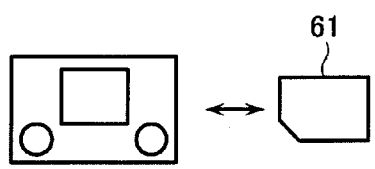
Figure 20E:
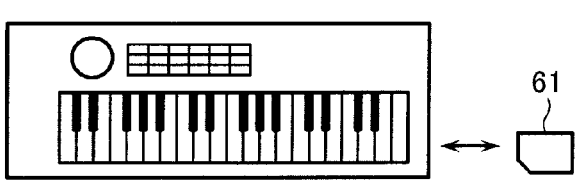
Figure 20F:
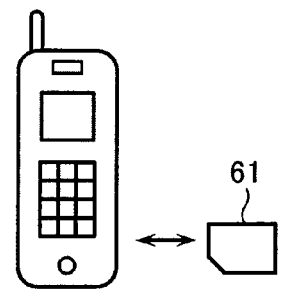
Figure 20G:
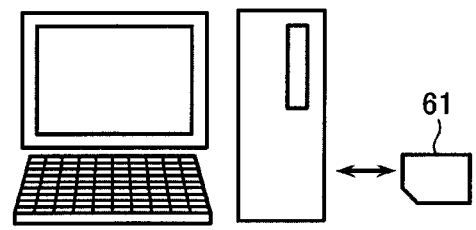
Figure 20H:
Figure 20I:
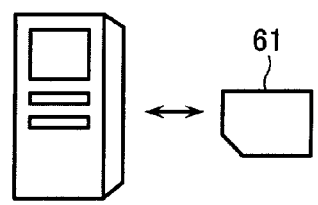
Figure 20J:
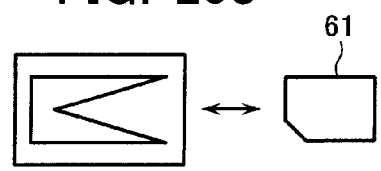

FIG. 19 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 20A to 20J, as well as in portable electric devices. That is, the electric card can also be used in a video camera shown in FIG. 20A, a television set shown in FIG. 20B, an audio apparatus shown in FIG. 20C, a game apparatus shown in FIG. 20D, an electric musical instrument shown in FIG. 20E, a cell phone shown in FIG. 20F, a personal computer shown in FIG. 20G, a personal digital assistant (PDA) shown in FIG. 20H, a voice recorder shown in FIG. 20I, and a PC card shown in FIG. 20J.

This invention is not limited to the above-described embodiment. It will be understood by those skilled in the art that various changes in form and detail may be made without departing from the spirit, scope, and teaching of the invention.

What is claimed is:

1. A semiconductor memory device comprising:
    a memory cell array with electrically rewritable and non-volatile memory cells arranged therein;
    a data storage circuit configured to store data simultaneously read from or written into the memory cell array, the data constituting a page; and
    a data state judgment circuit configured to sequentially judge the data states of multiple divided areas, which are obtained by dividing the page,
    the data storage circuit comprising data latches prepared in a sense amplifier circuit for sensing data of the memory cell array, and
    the data state judgment circuit being a verify-judge circuit configured to sequentially verify-judge the divided areas based on verify-read data stored in the data latches, thereby to judge write completion or erase completion,
    the verify-judge circuit comprising:
    fail detection circuits disposed in the divided areas and configured to detect a fail number for the corresponding divided area; and
    a division control circuit configured to selectively activate the fail detection circuits.

2. The semiconductor memory device according to claim 1, wherein
    the verify-judge circuit further comprises a permissible fail number setting circuit for setting a permissible fail number.

3. The semiconductor memory device according to claim 1, wherein
    the fail detection circuits have divided area detection lines, each of which is changed in level when the verify-read result is fail for the corresponding divided area, and the verify-judge circuit further comprises:
a collective detection line configured to carry a fail current corresponding to a fail number in accordance with the level change of each of the divided area detection lines when the fail detection circuits are selectively activated; and
a current comparator configured to compare the fail current flowing on the collective detection line with a reference current serving as a judgment basis of a permissible fail number, thereby outputting a judged signal.

4. The semiconductor memory device according to claim 3, wherein
the current comparator comprises a variable reference current source, which is configured to carry the reference current defined in correspondence with the permissible fail number.

5. The semiconductor memory device according to claim 4, wherein the verify-judge circuit further comprises;
a permissible fail number setting circuit configured to determine the reference current of the reference current source;
a register configured to accumulate the fail numbers in the respective divided areas to hold the accumulation result; and
a comparator configured to compare the output of the register with a total permissible fail number, thereby outputting a PASS/FAIL signal.

6. The semiconductor memory device according to claim 3, wherein the fail detection circuits each comprises:
a detection transistor, the gate of which is coupled to the divided area detection line, the drain of the detection transistor being coupled to the collective detection line; and
a selection transistor connected in series to the detection transistor to be driven by a selection signal for selecting the divided areas.

7. The semiconductor memory device according to claim 3, further comprising:
an address buffer configured to take in externally supplied address with such a function as to sequentially generate address pre-decode signals of the page at a verify-judge time; and
pre-decode signal lines disposed on the sense amplifier circuit area, to which the address pre-decode signals are supplied, wherein
the fail detection circuits each comprises:
a detection transistor, the gate of which is coupled to the divided area detection line, the drain of the detection transistor being coupled to the collective detection line;
an activation transistor connected in series to the detection transistor to be activated by a common selection signal for the divided areas; and
a selection transistor connected in series to the detection transistor and the activation transistor to be driven by the address pre-decode signal corresponding to one of the divided areas.

8. The semiconductor memory device according to claim 1, wherein
the memory cell array includes NAND cell units arranged therein, each NAND cell unit having multiple memory cells connected in series.

9. A semiconductor memory device comprising:
a memory cell array with electrically rewritable and non-volatile memory cells arranged therein;
a sense amplifier circuit configured to store data constituting a page, the data being simultaneously read from or written into the memory cell array; and
a verify-judge circuit configured to judge write completion or erase completion based on verify-read data stored in the sense amplifier in such a way as to sequentially verify-judging multiple divided areas, which are obtained by dividing the page,
the verify-judge circuit comprising:
fail detection circuits disposed in the divided areas and configured to detect a fail number for the corresponding divided area; and
a division control circuit configured to selectively activate the fail detection circuits.

10. The semiconductor memory device according to claim 9, wherein
the fail detection circuits have divided area detection lines, each of which is changed in level when the verify-read result is fail for the corresponding divided area,
the verify-judge circuit further comprises:
a collective detection line configured to carry a fail current corresponding to a fail number in accordance with the level change of each of the divided area detection lines when the fail detection circuits are selectively activated; and
a current comparator configured to compare the fail current flowing on the collective detection line with a reference current serving as a judgment basis of a permissible fail number, thereby outputting a judged signal.

11. The semiconductor memory device according to claim 10, wherein
the current comparator comprises a variable reference current source, which is configured to carry the reference current defined in correspondence with the permissible fail number.

12. The semiconductor memory device according to claim 11, wherein the verify-judge circuit further comprises;
a permissible fail number setting circuit configured to determine the reference current of the reference current source;
a register configured to accumulate the fail numbers in the respective divided area to hold the accumulation result; and
a comparator configured to compare the output of the register with a total permissible fail number, thereby outputting a PASS/FAIL signal.

13. The semiconductor memory device according to claim 10, wherein
the fail detection circuits each comprises:
a detection transistor, the gate of which is coupled to the divided area detection line, the drain of the detection transistor being coupled to the collective detection line; and
a selection transistor connected in series to the detection transistor to be driven by a selection signal for selecting the divided areas.

14. The semiconductor memory device according to claim 10, further comprising:
an address buffer configured to take in externally supplied address with such a function as to sequentially generate address pre-decode signals of the collective processing unit at a verify-judge time; and pre-decode signal lines disposed on the sense amplifier circuit area, to which the address pre-decode signals are supplied, wherein the fail detection circuits each comprises:

a detection transistor, the gate of which is coupled to the divided area detection line, the drain of the detection transistor being coupled to the collective detection line;

an activation transistor connected in series to the detection transistor to be activated by a common selection signal for the divided areas; and a selection transistor connected in series to the detection transistor and the activation transistor to be driven by the address pre-decode signal corresponding to one of the divided areas.

15. The semiconductor memory device according to claim 9, wherein the memory cell array includes NAND cell units arranged therein, each NAND cell unit having multiple memory cells connected in series.

* * * * *